United States Patent
Bang et al.

(10) Patent No.: US 10,529,699 B2
(45) Date of Patent: Jan. 7, 2020

(54) LIGHT SOURCE MODULE, METHOD OF MANUFACTURING THE MODULE, AND BACKLIGHT UNIT INCLUDING THE LIGHT SOURCE MODULE

(71) Applicant: SAMSUNG ELECTRONICS CO., LTD., Suwon-si, Gyeonggi-do (KR)

(72) Inventors: Jae-jun Bang, Hwaseong-si (KR); Seog-ho Lim, Seongnam-si (KR); Chang-ho Shin, Incheon (KR); Dong-soo Lee, Seongnam-si (KR); Sun Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/581,879

(22) Filed: Apr. 28, 2017

(65) Prior Publication Data

US 2018/0047712 A1    Feb. 15, 2018

(30) Foreign Application Priority Data

Aug. 11, 2016    (KR) ........................ 10-2016-0102444

(51) Int. Cl.
*H01L 27/15* (2006.01)
*H01L 25/13* (2006.01)
(Continued)

(52) U.S. Cl.
CPC ............ *H01L 25/13* (2013.01); *G02B 6/0051* (2013.01); *G02B 6/0055* (2013.01);
(Continued)

(58) Field of Classification Search
CPC ..... H01L 27/153; H01L 27/156; H01L 23/31; H01L 23/3107; H01L 23/3135; H01L 23/3142
See application file for complete search history.

(56) References Cited

U.S. PATENT DOCUMENTS 6,372,608 B1    4/2002  Shimoda et al.
6,645,830 B2    11/2003 Shimoda et al.
(Continued)

FOREIGN PATENT DOCUMENTS

JP    2007-194518 A    8/2007
KR   10-2011-0058987 A    6/2011
(Continued)

OTHER PUBLICATIONS

Korean Office action dated Aug. 1, 2019 for corresponding application KR 10-2016-0102444.

*Primary Examiner* — Jae Lee

(74) *Attorney, Agent, or Firm* — Lee & Morse, P.C.

(57) ABSTRACT

Provided are a light source module and a backlight unit (BLU) including the same. The light source module includes a substrate including a base plate extending in a first direction and a pair of dam structures stacked on opposing sides of the base plate along a second direction, orthogonal to the first direction, and extending along the base plate in the first direction, wherein the pair of dam structures are spaced apart from each other along a third direction, orthogonal to the first and second directions. A plurality of light-emitting devices are mounted on the substrate between the pair of dam structures and spaced apart from one another in the first direction. An encapsulation layer covers at least one side surface and a top surface of each of the plurality of light-emitting devices. A height of the pair of dam structures is greater than a height of the encapsulation layer.

17 Claims, 16 Drawing Sheets

(51) Int. Cl.
  *F21V 8/00* (2006.01)
  *H01L 33/48* (2010.01)
  *H01L 33/56* (2010.01)
  *H01L 25/075* (2006.01)
  *H01L 33/50* (2010.01)
  *H01L 33/60* (2010.01)
  *H01L 33/38* (2010.01)

(52) U.S. Cl.
  CPC ........ *H01L 25/0753* (2013.01); *H01L 33/483* (2013.01); *H01L 33/56* (2013.01); *H01L 33/382* (2013.01); *H01L 33/502* (2013.01); *H01L 33/60* (2013.01); *H01L 2933/0091* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,294,168 B2 | 10/2012 | Park et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0127558 A1* | 6/2011 | Park ........................ H01L 33/54 257/98 |
| 2014/0138725 A1* | 5/2014 | Oyamada ............... H01L 33/505 257/98 |
| 2015/0062494 A1 | 3/2015 | Park |
| 2015/0155459 A1 | 6/2015 | Ishihara et al. |
| 2015/0349211 A1 | 12/2015 | Zhang et al. |
| 2016/0020371 A1* | 1/2016 | Kang ....................... H01L 33/60 257/91 |
| 2016/0133884 A1 | 5/2016 | Hwang et al. |
| 2017/0309601 A1* | 10/2017 | Hsing Chen ........ H01L 25/0753 |

FOREIGN PATENT DOCUMENTS

| | | |
|---|---|---|
| KR | 10-2012-0041019 A | 4/2012 |
| KR | 10-1319360 B1 | 10/2013 |
| KR | 10-1456921 B1 | 11/2014 |

* cited by examiner

LIGHT SOURCE MODULE, METHOD OF MANUFACTURING THE MODULE, AND BACKLIGHT UNIT INCLUDING THE LIGHT SOURCE MODULE

CROSS-REFERENCE TO RELATED APPLICATION

Korean Patent Application No. 10-2016-0102444, filed on Aug. 11, 2016, in the Korean Intellectual Property Office, and entitled: "Light Source Module, Method of Manufacturing the Module, and Backlight Unit Including the Light Source Module," is incorporated by reference herein in its entirety.

BACKGROUND

1. Field

Embodiments relate to a light source module and a backlight unit (BLU) including the same, and, more particularly, to a light source module including light emitting devices (LEDs) and a BLU including the light source module.

2. Description of the Related Art

The demand for large-area highly efficient display apparatuses has increased. BLUs for the display apparatuses may be classified into edge-type BLUs and direct-type BLUs depending on a position of a light source in a display apparatus. Among these, the edge-type BLUs may be used to manufacture ultra-slim display apparatuses, rather than the direct-type BLUs. However, since the number of light-emitting device packages that may be contained in an edge-type BLU is limited, it is difficult to realize an edge-type BLU having high light intensity.

SUMMARY

One or more embodiments provides a light source module including a base plate extending in a first direction and a pair of dam structures stacked on opposing sides of the base plate along a second direction, orthogonal to the first direction and extending along the base plate in the first direction. The pair of dam structures are spaced apart from each other along a third direction, orthogonal to the first and second directions. A plurality of light-emitting devices are mounted on the substrate between the pair of dam structures. The light-emitting devices are spaced apart from one another in the first direction. An encapsulation layer covers at least a side surface and a top surface of each of the plurality of light-emitting devices. The encapsulation layer spaced from the pair of dam structures. A first height of the pair of dam structures from a top surface of the base plate is greater than a second height of a top surface of the encapsulation layer.

One or more embodiments provides a light source module including a base plate extending in a first direction and a pair of dam structures stacked on opposing sides of the base plate along a second direction, orthogonal to the first direction and extending along the base plate in the first direction. The pair of dam structures are spaced apart from each other along a third direction, orthogonal to the first and second directions. A plurality of light-emitting devices are mounted on the substrate between the pair of dam structures. The light-emitting devices are spaced apart from one another in the first direction. An encapsulation layer covers a side surface and a top surface of each of the plurality of light-emitting devices. Two sidewalls of the encapsulation layer are defined by the pair of dam structures. Adjacent light-emitting devices are spaced apart by a first pitch in the first direction and constitute a linear light-emitting module. The first pitch ranges from about 125% to about 500% of a first width of each of the plurality of light-emitting devices in the first direction.

One or more embodiments provides a method of manufacturing a light source module. The method includes providing a substrate including a base plate and a pair of dam structures. The base plate extends in a first direction and the pair of dam structures are stacked along a second direction, orthogonal to the first direction, and extend in the first direction on two edges of the base plate and are spaced apart from one another along a third direction, orthogonal to the first and second directions. A plurality of light-emitting device middle packages are provided. Each of the plurality of light-emitting device middle packages includes a light-emitting device and an encapsulation layer covering at least one side surface and a top surface of the light-emitting device. The plurality of light-emitting device middle packages are mounted on the base plate such that the plurality of light-emitting device middle packages are spaced apart from the pair of dam structures in a second direction perpendicular to the first direction.

One or more embodiments provides a BLU including a light source module, and a light guide plate (LGP) to receive light emitted by the light source module and emit the light. The light source module includes a substrate including a base plate extending in a first direction and a pair of dam structures extending on two edges of the base plate. The pair of dam structures are spaced apart from each other. A plurality of light-emitting devices are mounted between the pair of dam structures on the substrate and spaced apart from one another in the first direction. An encapsulation layer covers at least one side surface or a top surface of each of the plurality of light-emitting devices. A first height of the pair of dam structures on a top surface of the base plate is greater than a second height from the top surface of the base plate to a top surface of the encapsulation layer. The light source module is located on one side surface of the LGP. The plurality of light-emitting devices have an orientation angle of about 100° to about 130° due to the pair of dam structures.

One or more embodiments provides a light source module including a substrate including a base plate extending in a first direction and a pair of dam structures stacked on opposing sides of the base plate along a second direction, orthogonal to the first direction and extending along the base plate in the first direction, wherein the pair of dam structures are spaced apart from each other along a third direction, orthogonal to the first and second directions, a plurality of light-emitting devices mounted between the pair of dam structures on the substrate and spaced apart from one another in the first direction, and an encapsulation layer covering at least one side surface and a top surface of each of the plurality of light-emitting devices, the light emitting devices being spaced apart from the pair of dam structures in the third direction. A first height of the pair of dam structures from a top surface of the base plate is greater than a second height from the top surface of the base plate to a top surface of the encapsulation layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
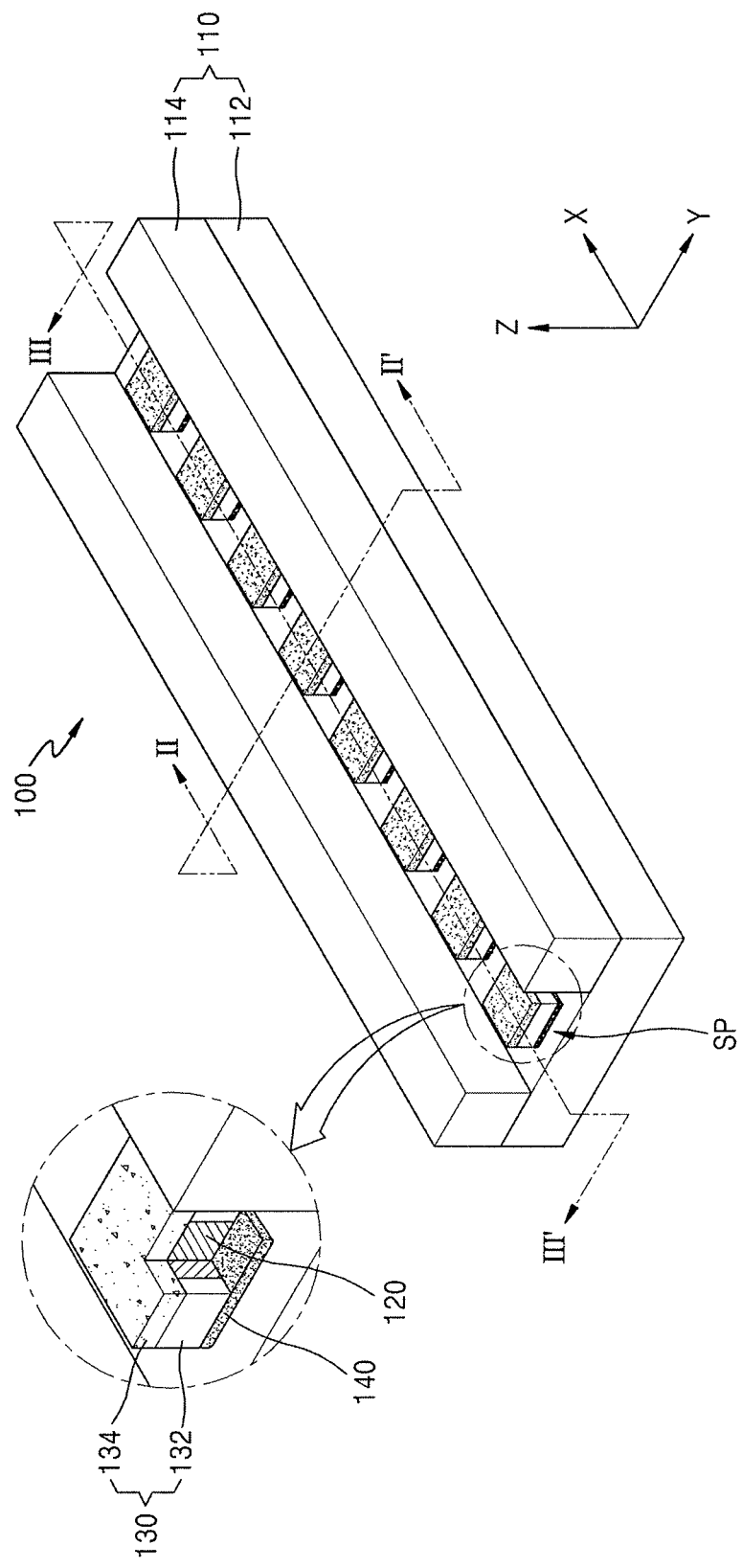
FIG. 1 illustrates a perspective view of a light source module according to an embodiment.
Figure 2:
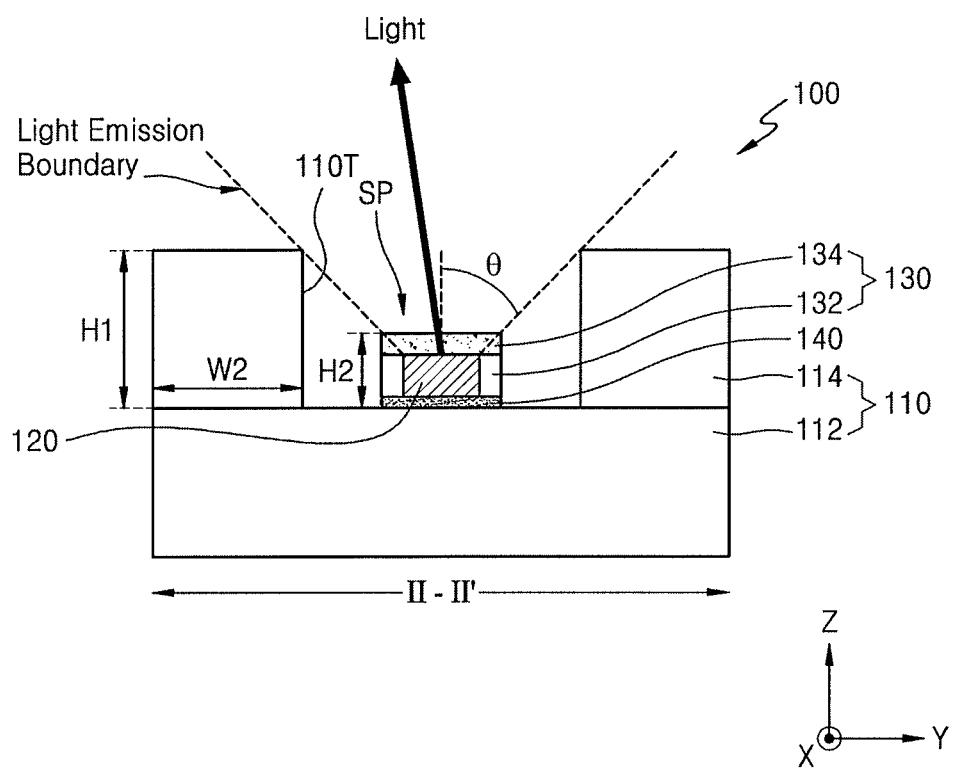
FIG. 2 illustrates a cross-sectional view taken along a line II-II' of FIG. 1.
Figure 3:
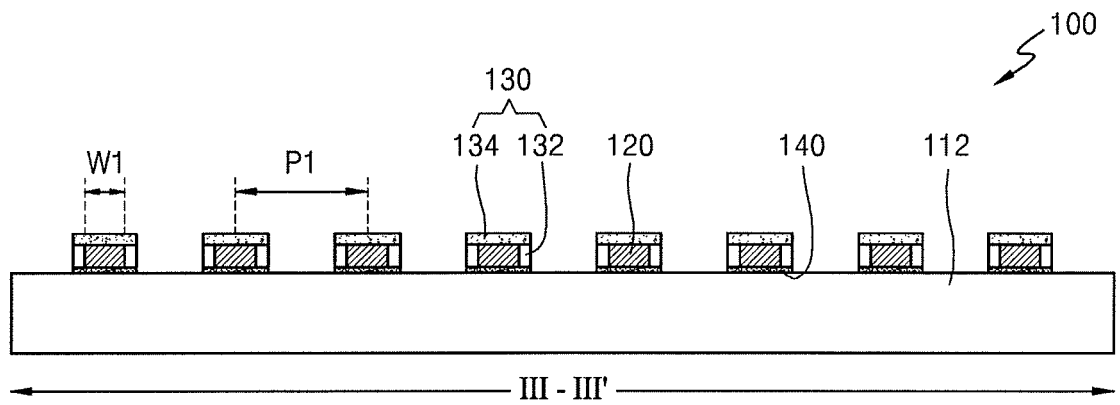
FIG. 3 illustrates a cross-sectional view taken along a line of FIG. 1.
Figure 4:
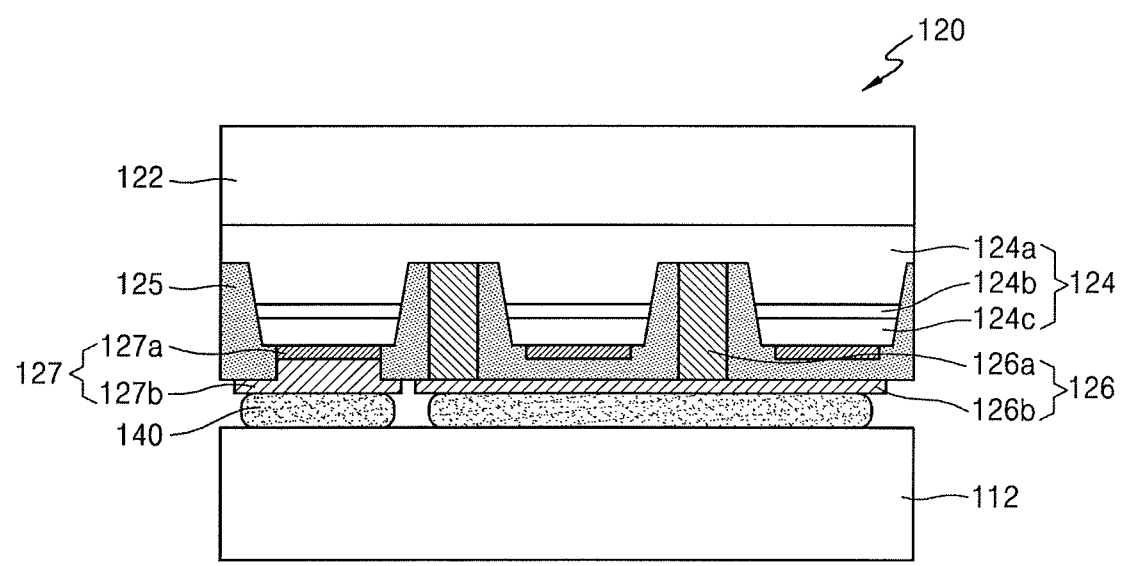
FIG. 4 illustrates a cross-sectional view of a plurality of light-emitting devices of FIG. 1.

FIG. 1 is a perspective view of a light source module 100 according to an embodiment. FIG. 2 is a cross-sectional view taken along a line II-II' of FIG. 1, and FIG. 3 is a cross-sectional view taken along a line of FIG. 1. FIG. 4 is a cross-sectional view of a plurality of light-emitting devices 120 of FIG. 1. Referring to FIGS. 1 to 4, the light source module 100 may include a substrate 110 and a plurality of light-emitting devices 120 mounted on the substrate 110.

The substrate 110 may include a base plate 112 and a pair of dam structures 114 stacked on the base plate 112 along a second direction (Z direction of FIG. 1 or a height direction of the substrate 110). The base plate 112 may extend to a predetermined length in a first direction (an X direction of FIG. 1 or a lengthwise direction of the substrate 110). Although not shown, the base plate 112 may be a printed circuit board (PCB) in which and/or on which circuit patterns are formed. For example, the base plate 112 may include a stack structure including a metal base including, e.g., aluminum, an insulating layer covering the metal base, and the circuit patterns provided on the insulating layer. For example, the base plate 112 may be a metal copper clad laminate (MCCL). However, a structure of the base plate 112 is not limited thereto.

The pair of dam structures 114 may be formed on a top surface of the base plate 112 and extend in the first direction (or the lengthwise direction of the substrate 110). The pair of dam structures 114 may be spaced apart from each other along a third direction (a Y direction of FIG. 1 or a widthwise direction of the substrate 110) on two edges of the base plate 112 and extend in the first direction. A light-emitting device mounting space 110T may be defined between the pair of dam structures 114 and the base plate 112.

In an embodiment, the pair of dam structures 114 may include a resin, transparent plastic, opaque plastic, or an insulating sheet. For example, the pair of dam structures 114 may include at least one material selected from the group of bismaleimide triazine (BT) resin, Frame Retardant 4 (FR4) resin, polyimide, polyester, tetrafunctional epoxy, polyphenylene ether, epoxy/polyphenylene oxide, Thermount®, cyanate ester, a liquid polymer, etc. In an embodiment, the formation of the pair of dam structures 114 may include bonding, e.g., an FR4 resin to the base plate 112 at a temperature of about 150° C. to about 200° C. for about several tens of minutes to several hours by using a thermal compression bonding technique.

As shown in FIG. 2, the pair of dam structures 114 may have sidewalls that are substantially vertical to the top surface of the base plate 112, e.g., parallel to the second direction. However, embodiments are not limited thereto, and the sidewalls of the pair of dam structures 114 may be inclined at a predetermined angle with respect to the top surface of the base plate 112. For example, unlike shown in FIG. 2, an upper width of the pair of dam structures 114 may be less than a lower width thereof. In this case, the sidewalls of the pair of dam structures 114 may be inclined so that an upper width of the light-emitting device mounting space 110T may be greater than a lower width thereof For example, the sidewalls of the pair of dam structures 114 may be inclined at an inclination angle of about 20° or less. When the inclination angle of the sidewalls of the pair of dam structures 114 is excessively large, an orientation angle of light emitted by the light-emitting device 120 may increase to some extent. In this case, the light source module 100 may not be appropriate for a light source module included in an edge-type BLU.

The pair of dam structures 114 may have a first height H1 from a top surface of the base plate 112 in the second direction (Z direction in FIG. 1) that is perpendicular to the first direction. The first height H1 of the pair of dam structures 114 may range from about 200 μm to about 5 mm. The pair of dam structures 114 may have a width W2 of about 200 μm to about 2 mm. However, the first height H1 and the width W2 of the pair of dam structures 114 are not limited thereto, and may be determined in consideration of bonding strength between the pair of dam structures 114 and the base plate 112, a size of the light-emitting device 120, a light intensity or orientation angle required for the light source module 100, a thickness of a BLU including the light source module 100, and so forth.

A plurality of light-emitting devices 120 may be mounted on the substrate 110 in the first direction (or the lengthwise direction of the substrate 110). The plurality of light-emitting devices 120 may be mounted on the base plate 112 by using a flip-chip technique.

As shown in FIG. 4, the plurality of light-emitting devices 120 may include a semiconductor substrate 122 and a semiconductor stack structure 124 on the semiconductor substrate 122. The semiconductor stack structure 124 may include a first-conductivity-type semiconductor layer 124a, an active layer 124b, and a second-conductivity-type semiconductor layer 124c that are stacked sequentially on the semiconductor substrate 122 along the second direction towards the base plate 112. A buffer layer may be further formed between the semiconductor substrate 122 and the first-conductivity-type semiconductor layer 124a.

In addition, each light-emitting device 120 may include a first electrode 126 and a second electrode 127. The first electrode 126 may be connected to the first-conductivity-type semiconductor layer 124a and the second electrode 127 may be connected to the second-conductivity-type semiconductor layer 124c.

The first electrode 126 may include a connection electrode unit 126a (e.g., a conductive via) and a first electrode pad 126b. The connection electrode unit 126a may be connected to the first-conductivity-type semiconductor layer 124a by extending through the second-conductivity-type semiconductor layer 124c and the active layer 124b, and the first electrode pad 126b may be connected to the connection electrode unit 126a. The connection electrode unit 126a may be surrounded by an insulating layer 125 and electrically isolated from the active layer 124b and the second-conductivity-type semiconductor layer 124c. The connection electrode unit 126a may be located in a region where the semiconductor stack structure 124 has been removed, e.g., etched.

The second electrode 127 may include an ohmic contact layer 127a and a second electrode pad 127b located on the second-conductivity-type semiconductor layer 124c, e.g., stacked thereon along the second direction towards the base plate 112.

The connection electrode unit 126a and the ohmic contact layer 127a may include single structures or multi-layered structures including conductive materials, which have ohmic characteristics with respect to the first- and second-conductivity-type semiconductor layers 124a and 124c. For example, the connection electrode unit 126a and the ohmic contact layer 127a may be formed by depositing or sputtering at least one of materials, e.g., silver (Ag), aluminum (Al), nickel (Ni), chromium (Cr), and a transparent conductive oxide (TCO).

The first and second electrode pads 126b and 127b may be connected to the connection electrode unit 126a and the ohmic contact layer 127a, respectively, and function as external terminals of the plurality of light-emitting devices 120. For example, the first and second electrode pads 126b and 127b may include gold (Au), Ag, Al, titanium (Ti), tungsten (W), copper (Cu), tin (Sn), Ni, platinum (Pt), Cr, nickel tin (NiSn), titanium tungsten (TiW), gold tin (AuSn), or an eutectic metal thereof.

The plurality of light-emitting devices 120 may be mounted on the base plate 112 by using an adhesive layer 140. The adhesive layer 140 may be, e.g., a solder layer. The first and second electrode pads 126b and 127b of the plurality of light-emitting devices 120 may be electrically connected to circuit patterns located in the base plate 112 via the adhesive layer 140.

Although detailed structures of the plurality of light-emitting devices 120 have been described with reference to FIG. 4, structures and shapes of the plurality of light-emitting devices 120 are not limited to those shown in FIG. 4. Unlike shown in FIG. 4, structures or shapes of the plurality of light-emitting devices 120 may be variously changed. For example, a V-pit or an uneven portion may be formed between the semiconductor substrate 122 and the semiconductor stack structure 124. Alternatively, the semiconductor stack structure 124 may include a plurality of nano light-emitting structures.

As may be seen in FIGS. 1 to 3, an encapsulation layer 130 may be located on top surfaces and side surfaces of the plurality of light-emitting devices 120. The encapsulation layer 130 may substantially cover entire areas of the top surfaces and side surfaces of the plurality of light-emitting devices 120. The encapsulation layer 130 may include a side encapsulation layer 132 and a top encapsulation layer 134.

Each of the plurality of light-emitting devices 120 and the encapsulation layer 130 surrounding each of the plurality of light-emitting devices 120 may be referred to together as a "soft package SP", and the soft package SP may be mounted on the substrate 110. Here, the soft package SP (or a middle package) may be different from a conventional light-emitting device package in which a plurality of light-emitting devices are fixed to a lead frame and an encapsulant and a phosphor layer are formed on the lead frame. For example, a conventional light-emitting device package may include a light-emitting device mounted on a lead frame. Thus, the conventional light-emitting device package may have a relatively large height and/or width. In contrast, the soft package SP may not include an additional lead frame. Accordingly, the soft package SP including the plurality of light-emitting devices 120 and the encapsulation layer 130 surrounding the plurality of light-emitting devices 120 may have a compact height and/or width.

The side encapsulation layer 132 may surround at least one side surface of each of the plurality of light-emitting devices 120. In an embodiment, the side encapsulation layer 132 may be located on substantially an entire area of the side surface of each of the plurality of light-emitting devices 120. The side encapsulation layer 132 may include a resin in which dispersion particles of at least one selected from the group consisting of titanium oxide ($TiO_2$), zinc oxide (ZnO), silica, aluminum oxide ($Al_2O_3$), and magnesium oxide (MgO) are dispersed. The side encapsulation layer 132 may scatter light emitted by the side surfaces of the plurality of light-emitting devices 120. Thus, light emitted by the side surfaces of the plurality of light-emitting devices 120 may be reflected or scattered by the side encapsulation layer 132 and emitted through the top surfaces of the plurality of light-emitting devices 120 out of the soft package SP.

The top encapsulation layer 134 may cover the top surface of each of the plurality of light-emitting devices 120. In an embodiment, the top encapsulation layer 134 may be located on the entire top surface of each of the plurality of light-emitting devices 120 and a top surface of the side encapsulation layer 132 surrounding the side surface of each of the plurality of light-emitting devices 120. The top encapsulation layer 134 may have a substantially planar top level.

As shown in FIG. 2, a sidewall of the top encapsulation layer 134 may be aligned with a sidewall of the side encapsulation layer 132. In forming the soft package SP, after the side encapsulation layer 132 is formed to surround sidewalls of the plurality of light-emitting devices 120 and the top encapsulation layer 134 is formed to cover the side encapsulation layer 132 and the top surfaces of the plurality of light-emitting devices 120, the side encapsulation layer 132 and the top encapsulation layer 134 may be sawed, thereby forming the soft package SP in which each of the light-emitting devices 120 is surrounded by the side encapsulation layer 132 and the top encapsulation layer 134. However, embodiments are not limited thereto.

The top encapsulation layer 134 may include a resin in which phosphor is dispersed or a phosphor-free resin. For example, the top encapsulation layer 134 may include a phosphor film or a silicone resin. In an embodiment, the top encapsulation layer 134 may include a phosphor film in which phosphor particles are uniformly dispersed at a predetermined concentration. The phosphor particles may be a wavelength conversion material configured to convert wavelength of light emitted by the plurality of light-emitting devices 120. For example, when the plurality of light-emitting devices 120 are blue light-emitting devices to emit light having a peak intensity in a blue wavelength range, the top encapsulation layer 134 may include a phosphor film including yellow, green, red, orange, or a combination thereof Thus, white light may be emitted through the top encapsulation layer 134.

In an embodiment, phosphor may have various compositions and colors. For example, oxide-based phosphors, silicate-based phosphors, nitride-based phosphors, and fluoride-based phosphors may be used as the phosphor. For example, in a light source module used for a BLU, β-SiAlON:$Eu^{2+}$ (green), (Ca,Sr)$AlSiN_3$:$Eu^{2+}$ (red), $La_3Si_6N_{11}$:$Ce^{3+}$ (yellow), $K_2SiF_6$:$Mn^{4+}$ (red), $SrLiAl_3N_4$:Eu (red), $Ln_{4-x}(Eu_zM_{1-z})_xSi_{12-y}Al_yO_{3+x+y}N_{18-x-y}$ (0.5≤x≤3, 0<z<0.3, 0<y≤4) (red), $K_2TiF_6$:$Mn^{4+}$ (red), $NaYF_4$:$Mn^{4+}$ (red), and $NaGdF_4$:$Mn^{4+}$ (red) may be used as the phosphor. However, kinds of the phosphor are not limited to the above-described phosphors.

In a process according to an embodiment, the soft package SP may be formed by using a film-type top encapsulation layer 134 including phosphor. For example, when the top encapsulation layer 134 includes a phosphor film, the concentration of phosphor dispersed in the top encapsulation layer 134 may be precisely controlled so that emission quality of the light source module 100 may be further enhanced.

In another embodiment, the top encapsulation layer 134 may include a phosphor-free resin. In this case, a wavelength conversion material, such as quantum dots, may be located on the light source module 100. Each of the quantum dots may have a core-shell structure by using a Group III-V or II-VI compound semiconductor. For example, each of the quantum dots may have a core, such as cadmium selenide (CdSe) and indium phosphide (InP), and a shell, such as zinc sulfide (ZnS) and zinc selenide (ZnSe). Also, the quantum dots may include ligands for stabilizing the core and the shell. The ligands may be contained in an encapsulant and located on the light source module 100. Alternatively, the ligands may be prepared as a film type and adhered to the light source module 100 or a light guide plate (LGP).

As shown in FIG. 3, each of the plurality of light-emitting devices 120 may have a first width W1 in the first direction and adjacent light-emitting devices 120 may be spaced apart along the first direction by a first pitch P1 (here, the first pitch P1 refers to the sum of the first width W1 of each of the plurality of light-emitting devices 120 and a distance (refer to LD1 in FIG. 7) between two adjacent light-emitting devices 120). The first pitch P1 may range from about 125% to about 500% of the first width W1. For example, the plurality of light-emitting devices 120 may be spaced a relatively small first pitch P1 apart from one another in the first direction. Thus, the number of light-emitting devices 120 mounted on the substrate 110 may increase, and the light source module 100 having high light intensity may be realized.

In general, a conventional light-emitting device package in which a light-emitting device is mounted on a lead frame and a phosphor and an encapsulant surrounding the light-emitting device are formed on the lead frame may have a relatively large dimensions, e.g., height and/or width. Also, in the conventional light-emitting device package, only a limited number of light-emitting device packages may be mounted on a substrate.

In contrast, according to an embodiment, the soft package SP including the light-emitting device 120 and the encapsulation layer 130 surrounding the top surface and the side surface of the light-emitting device 120 may not include a lead frame. Thus, the soft package SP may have a relatively small height and/or width. Accordingly, the plurality of light-emitting devices 120 may be mounted at a relatively small pitch in the substrate 110, and the light source module 100 may have high light intensity.

In addition, as shown in FIG. 2, the pair of dam structures 114 may have the first height H1 along the second direction from the top surface of the base plate 112, the soft package SP may have a second height H2 along the second direction from the top surface of the base plate 112. The first height H1 may be greater than or equal to the second height H2. Here, the second height H2 may correspond to a height from the top surface of the base plate 112 to a top surface of the encapsulation layer 130 (e.g., a top surface of the top encapsulation layer 134). In an embodiment, the first height H1 may range from about 100% to about 400% of the second height H2. For example, the first height H1 may range from about 100% to about 200% of the second height H2.

Since the first height H1 of the pair of dam structures 114 ranges from about 100% to about 400% of the second height H2 of the soft package SP, a light emission boundary from the light-emitting device 120 may be defined by the pair of dam structures 114. As shown in FIG. 2, top surfaces of the pair of dam structures 114 may be at a higher level than the top surface of the soft package SP. As compared with a conventional case in which a light-emitting device is mounted on a planar PCB, an orientation angle of light emitted by the light-emitting device 120 may be reduced. In an embodiment, an orientation angle 2 θ of light emitted by the light-emitting device 120 may range from about 100° to about 130°. For example, an orientation angle 2 θ of light emitted by the light-emitting device 120 may range from about 110° to 120°.

In general, in a display apparatus adopting an edge-type BLU, when an orientation angle of light emitted by the light source module 100 is relatively large, a thickness of an LGP included in the edge-type BLU may increase. However, it may be desirable to use an LGP having a small thickness to obtain a slim display apparatus. In the light source module 100, light emitted by the light-emitting device 120 may have a relatively small orientation angle due to the pair of dam structures 114. Thus, an LGP having a relatively small thickness may be adopted. Accordingly, a display apparatus including the light source module 100 may be slim.

In general, when the soft package SP is used as an edge-type BLU, the light-emitting device 120 may be vulnerable to mechanical and physical shock or damage. Accordingly, to protect the light-emitting device 120 from mechanical shock, a conventional light-emitting device package includes a lead frame to the edge-type BLU. However, in the light source module 100 according to an embodiment, the soft package SP may be protected by the pair of dam structures 114 from physical shock or damage. Accordingly, it may be unnecessary to perform a method of manufacturing a conventional light-emitting device package including a lead frame, and the light source module 100 may be manufactured by using a simplified manufacturing process.

In conclusion, according to the above-described light source module 100, a relatively large number of soft packages SP may be mounted on the substrate 110 including the pair of dam structures 114. Thus, the light source module 100 may have high light intensity. Also, a relatively small orientation angle may be obtained by the pair of dam structures 114, so that a BLU or display apparatus adopting the light source module 100 may slim.

Figure 5:
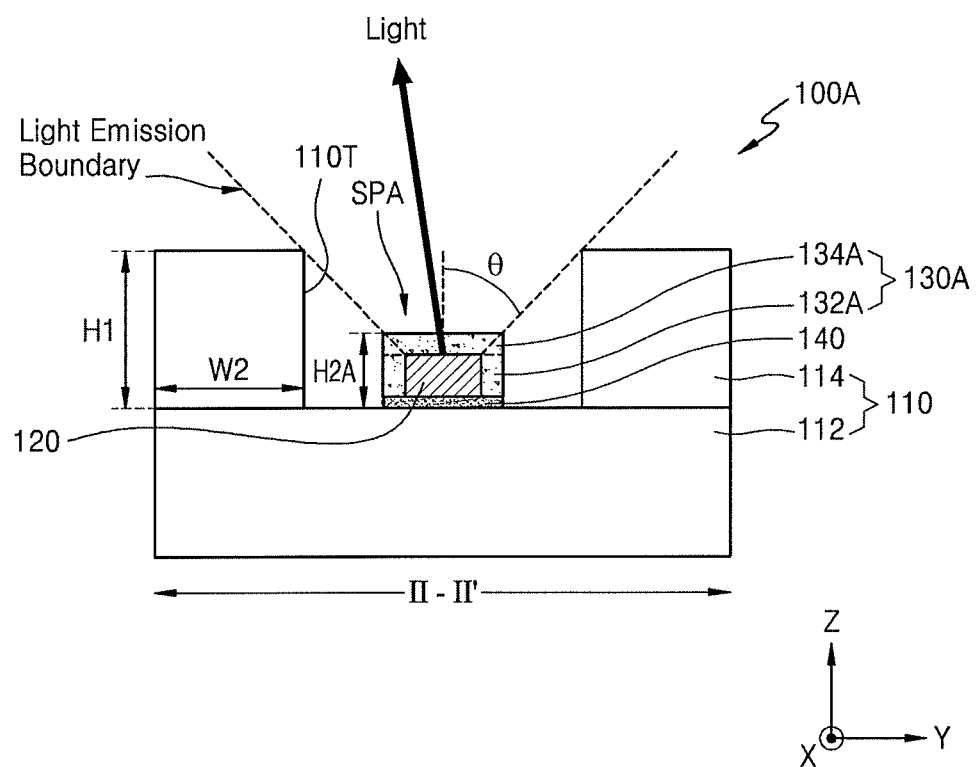
FIG. 5 illustrates a cross-sectional view of a light source module according to an embodiment.

FIG. 5 is a cross-sectional view of a light source module 100A according to an embodiment, which is taken along a line II-II' of FIG. 1. In FIG. 5, the same reference numerals are used to denote the same elements as in FIGS. 1 to 4.

Referring to FIG. 5, the plurality of light-emitting devices 120 may be located on the substrate 110. A top surface and a side surface of each of the plurality of light-emitting devices 120 may be surrounded by an encapsulation layer 130A, which is a single material layer.

The encapsulation layer 130A may include a side encapsulation layer 132A surrounding a side surface of each of the plurality of light-emitting devices 120 and a top encapsulation layer 134A surrounding top surfaces of the plurality of light-emitting devices 120. The side encapsulation layer 132A may include the same material as the top encapsulation layer 134A. For example, the side encapsulation layer 132A and the top encapsulation layer 134A may be formed by using the same process and unified (or integrally formed). Thus, a boundary between the side encapsulation layer 132A and the top encapsulation layer 134A may not be distinguished with the naked eye. In another case, even if the side encapsulation layer 132A and the top encapsulation layer 134A include the same material, the side encapsulation layer 132A and the top encapsulation layer 134A may be formed by using separate processes.

In an embodiment, the side encapsulation layer 132A and the top encapsulation layer 134A may include a resin in which phosphor is dispersed or a phosphor-free resin. For example, the side encapsulation layer 132A and the top encapsulation layer 134A may include a resin including yellow phosphor. Alternatively, the side encapsulation layer 132A and the top encapsulation layer 134A may include a silicone resin.

In a process of forming the encapsulation layer 130A, the top encapsulation layer 134A may be formed by using a liquid injection method or a spray method on a transfer substrate (refer to 210 in FIG. 11), and a plurality of light-emitting devices 120 may be adhered to the top encapsulation layer 134A. In this case, the plurality of light-emitting devices 120 may be located such that active surfaces (or emission surfaces) of the plurality of light-emitting devices 120 are in contact with the top encapsulation layer 134A and electrodes 126 and 127 of the plurality of light-emitting devices 120 face upward, away from the transfer substrate 210. Thereafter, a side encapsulation layer 132A may be formed on the top encapsulation layer 134A by using a liquid injection method or a spray method to surround side surfaces of the plurality of light-emitting devices 120. The side encapsulation layer 132A may include the same material as the top encapsulation layer 134A. Thereafter, the top encapsulation layer 134A and the side encapsulation layer 132A may be separated, e.g., sawed, to form a soft package SPA.

In forming the encapsulation layer 130A according to another embodiment, the plurality of light-emitting devices 120 may be fixed to the transfer substrate, and the encapsulation layer 130A may be formed by using a liquid injection method or a spray method to cover side surfaces and top surfaces of the plurality of light-emitting devices 120. Thereafter, the encapsulation layer 130A may be cured and separated, e.g., sawed, to form the soft package SPA.

FIG. 5 illustrates an example in which the encapsulation layer 130A has a planar top surface that is substantially parallel with a top surface of the base plate 112, but embodiments are not limited thereto. For example, the encapsulation layer 130A may have a top surface, which is inclined at a predetermined angle from the top surface of the base plate 112, or have a round or a convex top surface.

Figure 6:
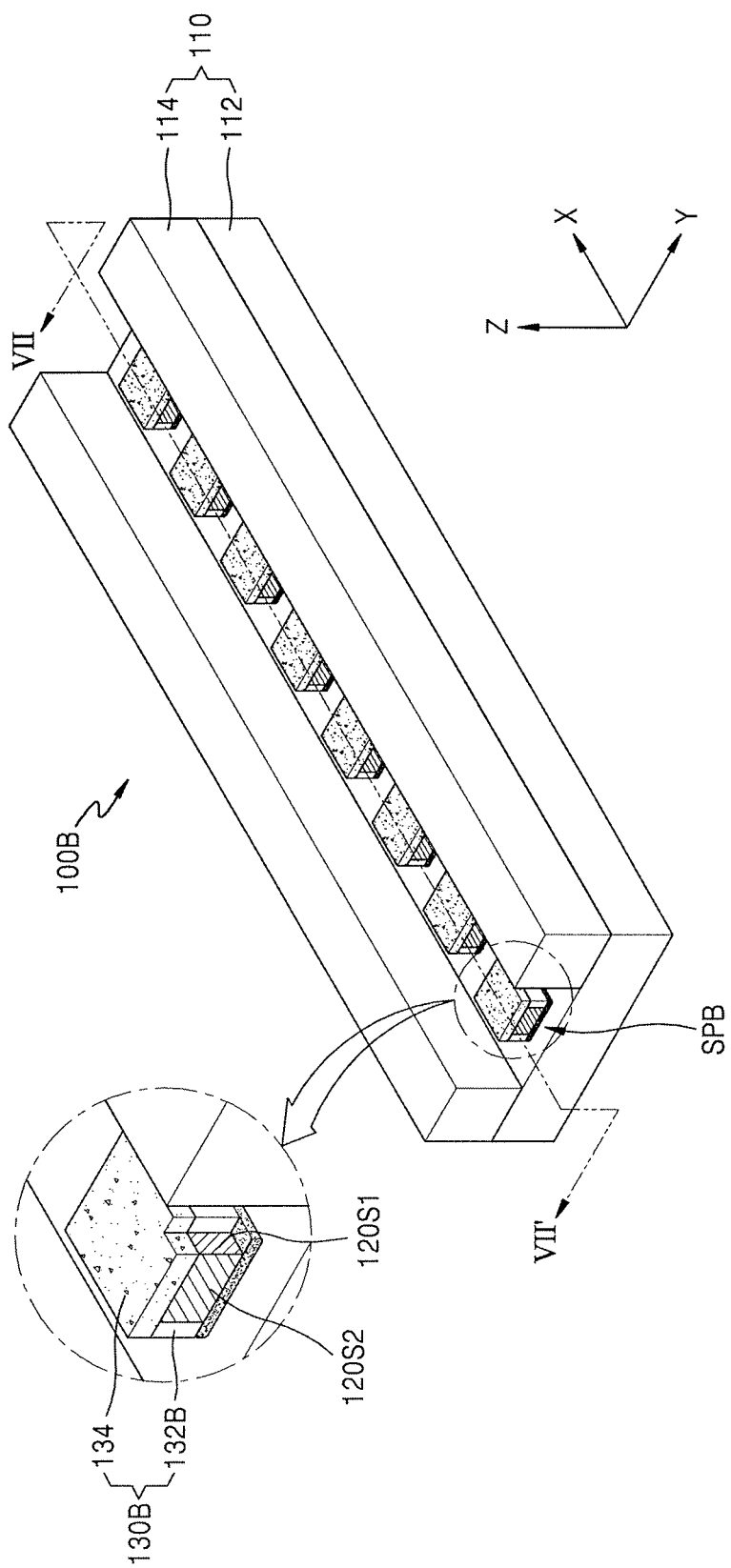
FIG. 6 illustrates a perspective view of a light source module according to an embodiment.
Figure 7:
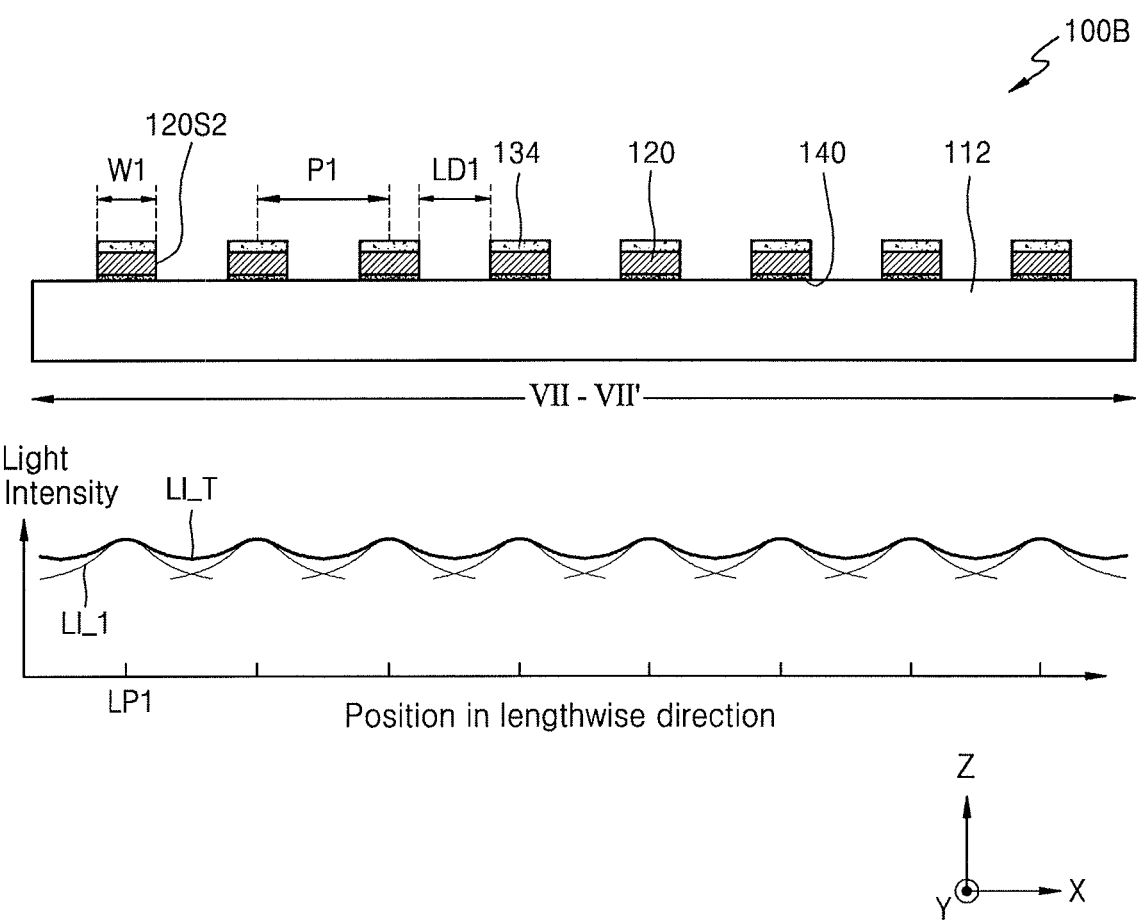
FIG. 7 illustrates a cross-sectional view taken along a line VII-VII' of FIG. 6.

FIG. 6 is a perspective view of a light source module 100B according to an embodiment. FIG. 7 is a cross-sectional view taken along a line VII-VII' of FIG. 6. In FIGS. 6 and 7, the same reference numerals are used to denote the same elements as in FIGS. 1 to 5.

Referring to FIGS. 6 and 7, a plurality of light-emitting devices 120 may be located on a substrate 110. Only a partial side surface of each of the plurality of light-emitting devices 120 may be surrounded by a side encapsulation layer 132B, e.g., side surfaces facing the dams 114. A material included in the side encapsulation layer 132B may be understood with reference to the side encapsulation layer 132 described above with reference to FIGS. 1 to 4.

Each of the plurality of light-emitting devices 120 may include a first side surface 120S1, which may face a pair of dam structures 114, and a second side surface 120S2, which may face an adjacent light-emitting device 120. The encapsulation layer 130B may include the side encapsulation layer 132B and a top encapsulation layer 134. The side encapsulation layer 132B may surround substantially the entire area of the first side surface 120S1, but not the second side surface 120S2. As shown in FIG. 6, one sidewall of the top encapsulation layer 134 may be aligned with a sidewall of the second side surface 120S2 of the light-emitting device 120, while another sidewall of the top encapsulation layer 134 may be aligned with a sidewall of the side encapsulation layer 132B.

Each of the plurality of light-emitting devices 120 may have a first width W1 in a first direction (X direction). Adjacent light-emitting devices 120 may be spaced at a first pitch P1 in the first direction. Here, the first pitch P1 may range from about 125% to about 500% of the first width W1. Also, adjacent light-emitting devices 120 may be spaced a first distance LD1 apart from one another in the first direction. The first distance LD1 may be about 25% to about 400% of the first width W1.

When the first pitch P1 is less than about 125% the first width W1, a sufficient distance (or safe distance) may not be ensured between adjacent light-emitting devices 120 so that a display apparatus cannot be stably driven. When the first pitch P1 is more than about 500% the first width W1, the number of plurality of light-emitting devices 120 mounted in the light source module 100B may be reduced, thereby precluding the manufacture of a display apparatus having high light intensity.

In general, the manufacture of an edge-type BLU may include forming a conventional light-emitting device package by adhering a light-emitting device to a lead frame, forming an encapsulation layer, and mounting the conventional light-emitting device package on a PCB. However, the conventional light-emitting device package may have a much larger width than the light-emitting device due to a size of the lead frame. For example, the width of the conventional light-emitting device package may correspond to about 300% to about 500% the first width W1 of the light-emitting device. Also, larger widths may result in greater distances between adjacent conventional light-emitting device packages. For example, when light-emitting devices having the same first width W1 are mounted in a conventional light-emitting device package, a pitch of the light-emitting devices may range from about 400% to about 600% of the first width W1 of the light-emitting devices (for example, a minimum pitch of conventional light-emitting device packages may be about three times a minimum value of the first pitch P1 in the light source module 100B). Accordingly, the number of conventional light-emitting device packages that may be included in an edge-type BLU may be limited, thereby precluding the manufacture of a display apparatus having high light intensity.

However, in the light source module 100B, soft packages SPB having a relatively small width W1 may be spaced a relatively small first pitch P1 apart from one another and mounted on the substrate 110. Accordingly, in the light source module 100B, a larger number of light-emitting devices 120 may be mounted than when a conventional light-emitting device package is used. Therefore, a display apparatus having high light intensity may be embodied.

In addition, since the side encapsulation layer 132B is not formed on the second side surfaces 120S2 of the plurality of light-emitting devices 120, a relatively large orientation angle may be ensured between side surfaces of the plurality of light-emitting devices 120, which may face each other in the first direction. That is, a linear light source having a small orientation angle in a second direction and a large orientation angle in the first direction may be formed due to the pair of dam structures 114.

A bottom part of FIG. 7 illustrates a graph of light intensity relative to a position in a lengthwise direction (X direction in FIG. 7) of the substrate 110. Light intensity of light emitted by the light-emitting device 120 located in a first position LP1 is denoted by a thin solid line LI_1, and the total light intensity of light emitted by the plurality of light-emitting devices 120 is denoted by a thick solid line LI_T. The light intensity LI_1 of light emitted by each of the light-emitting devices 120 has a maximum value in the first position LP1 of the light-emitting device 120 and is reduced away from a position of the light-emitting device 120 in the first direction. However, when the plurality of light-emitting devices 120 are spaced a relatively small pitch P1 apart from one another, the total light intensity LI_T of light emitted by the plurality of light-emitting devices 120 may have a relatively flat distribution (or a relatively low deviation) in the X direction.

Since the first pitch P1 of the plurality of light-emitting devices 120 is about 125% to about 500% of the first width W1 of the light-emitting devices 120, the light source module 100B may have a relatively uniform light intensity along the X direction. Also, since the side encapsulation layer 132B is not formed on side surfaces of the light-emitting devices 120 located in the X direction, the light-emitting devices 120 may have a relatively small orientation angle in the Y direction, but have a relatively large orientation angle in the X direction. That is, asymmetry in the orientation angle of the light source module 100B may be improved, and the light source module 100B may be used as a linear light source.

Figure 8:
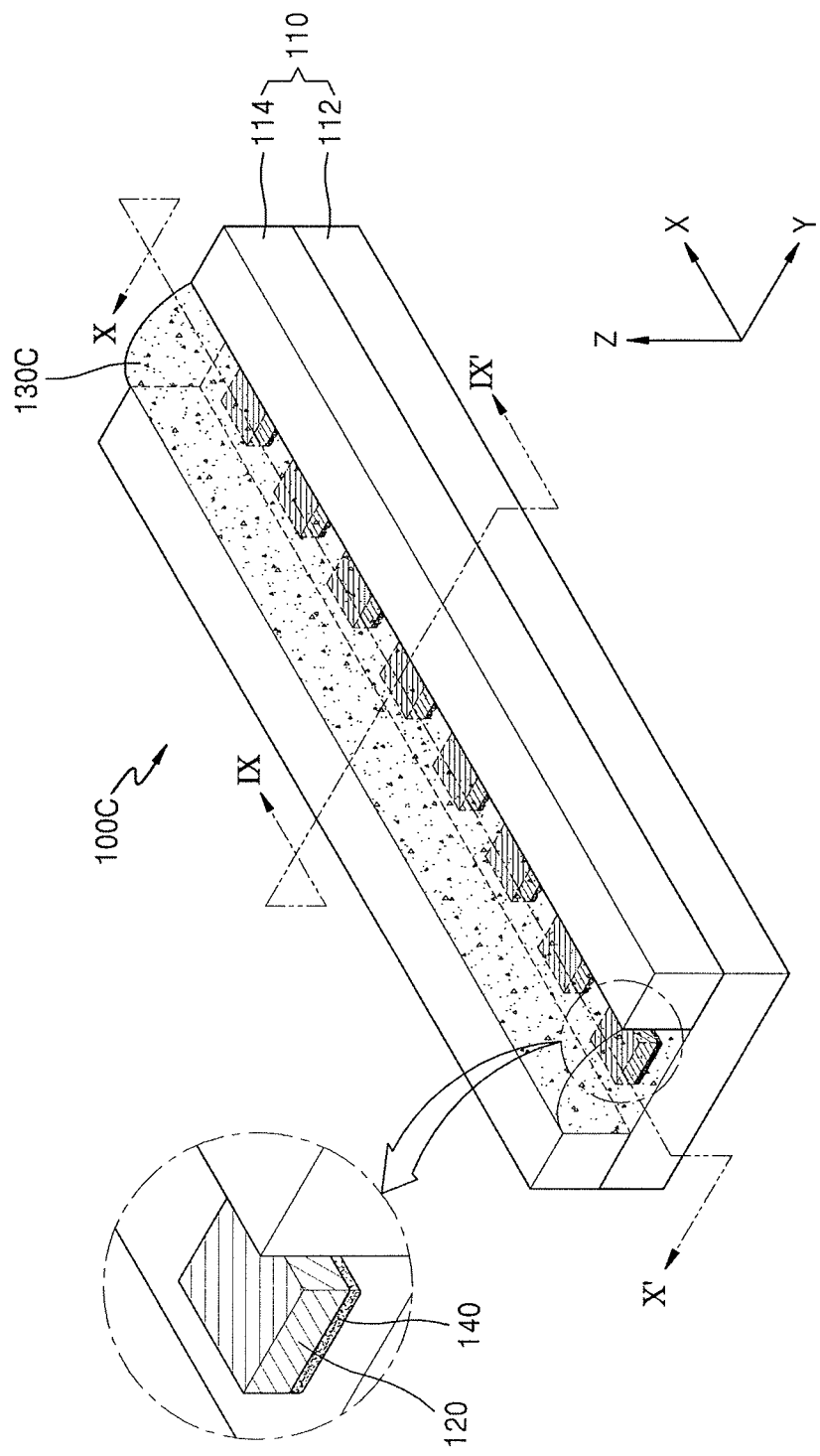
FIG. 8 illustrates a perspective view of a light source module according to an embodiment.
Figure 9:
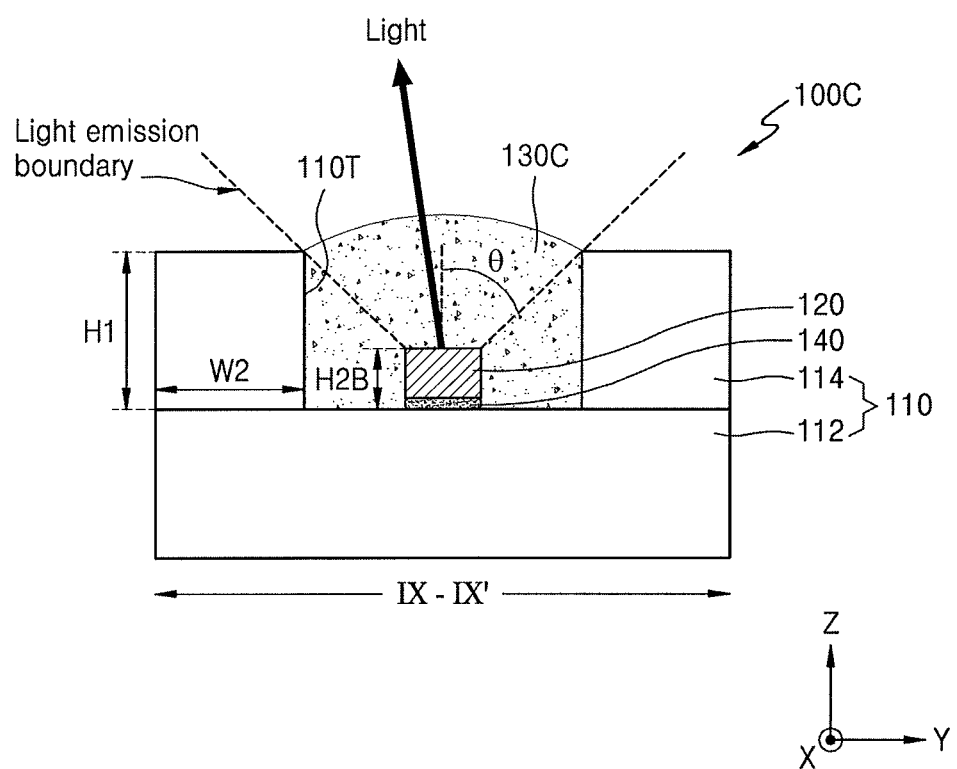
FIG. 9 illustrates a cross-sectional view taken along a line IX-IX' of FIG. 8.
Figure 10:
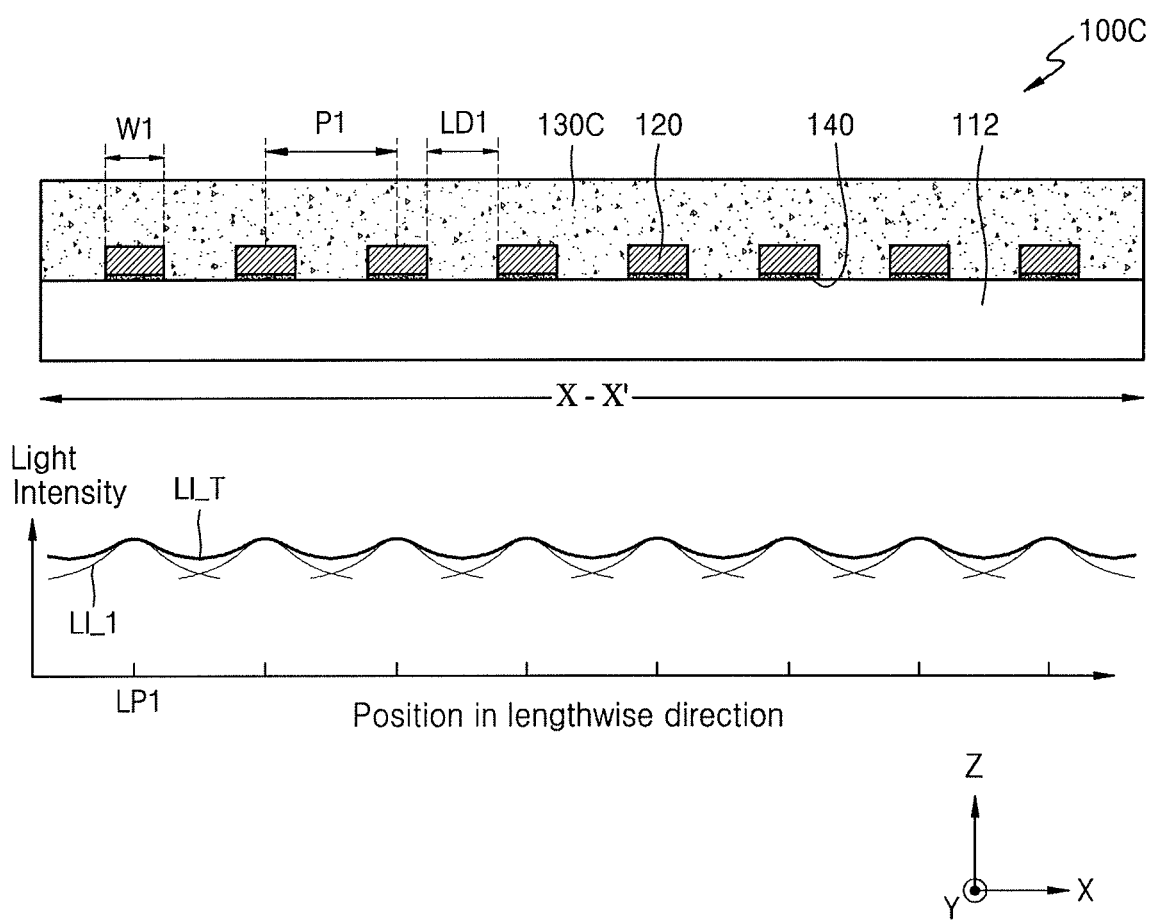
FIG. 10 illustrates a cross-sectional view taken along a line X-X' of FIG. 8.

FIG. 8 is a perspective view of a light source module 100C according to an embodiment. FIG. 9 is a cross-sectional view taken along a line IX-IX' of FIG. 8, and FIG. 10 is a cross-sectional view taken along a line X-X' of FIG. 8. In FIGS. 8 to 10, the same reference numerals are used to denote the same elements as in FIGS. 1 to 7.

Referring to FIGS. 8 to 10, the light source module 100C may include a plurality of light-emitting devices 120 that may be directly mounted on the substrate 110 by using a flip-chip technique. An encapsulation layer 130C may cover a plurality of light-emitting devices 120 and fill a light-emitting device mounting region 110T defined by the pair of dam structures 114 and the base plate 112. Two sidewalls of the encapsulation layer 130C may be in contact with opposing sidewalls of a pair of dam structures 114, and the encapsulation layer 130C may extend in a lengthwise direction of the substrate 110. As shown in FIG. 9, a top surface of the encapsulation layer 130C may have a convex shape upward. In another case, the top surface of the encapsulation layer 130C may have a planar top surface and be substantially coplanar with top surfaces of the pair of dam structures 114.

The encapsulation layer 130C may be formed by using a resin in which phosphor is dispersed or a phosphor-free resin. For example, the encapsulation layer 130C may be formed by mounting the plurality of light-emitting devices 120 on the base plate 112, supplying an encapsulation material to the inside of the light-emitting device mounting region 110T by using a liquid injection method or a spray method, and curing the encapsulation material.

Regions between the plurality of light-emitting devices 120 may be filled with the encapsulation layer 130C. The encapsulation layer 130C may diffuse light emitted by each of the plurality of light-emitting devices 120. Thus, light emitted by the light-emitting device 120 in a lengthwise direction of the substrate 110 may have a relatively large orientation angle. In contrast, light emitted by the light-emitting device 120 in the third direction (widthwise direction or Y direction) of the substrate 110 may have a relatively small orientation angle due to the pair of dam structures 114.

A bottom part of FIG. 10 illustrates a graph of light intensity relative to a position in a lengthwise direction (X direction in FIG. 10) of the substrate 110. In an embodiment, the plurality of light-emitting devices 120 may be spaced a relatively small first pitch P1 apart from one another, and the total light intensity of light emitted by the plurality of light-emitting devices 120 may have a relatively flat distribution (or a relatively small deviation) along the X direction. Also, since the encapsulation layer 130C is capable of diffusing light emitted by each of the plurality of light-emitting devices 120, the light may have a relatively large orientation angle in a lengthwise direction of the substrate 110. Asymmetry in the orientation angle of the light source module 100C may be improved, and the light source module 100C may be used as a linear light source module.

The encapsulation layer 130C may be in contact with the pair of dam structures 114 and surround a top surface and a side surface of each of the plurality of light-emitting devices 120. Accordingly, the pair of dam structures 114 and the encapsulation layer 130C may protect a plurality of light-emitting devices 120 from external mechanical shocks.

FIGS. 11 to 14 are cross-sectional views and a perspective view of stages in a method of manufacturing a light source module according to an embodiment. The method may be the method of manufacturing the light source module 100, which is described above with reference to FIGS. 1 to 3.

Figure 11:
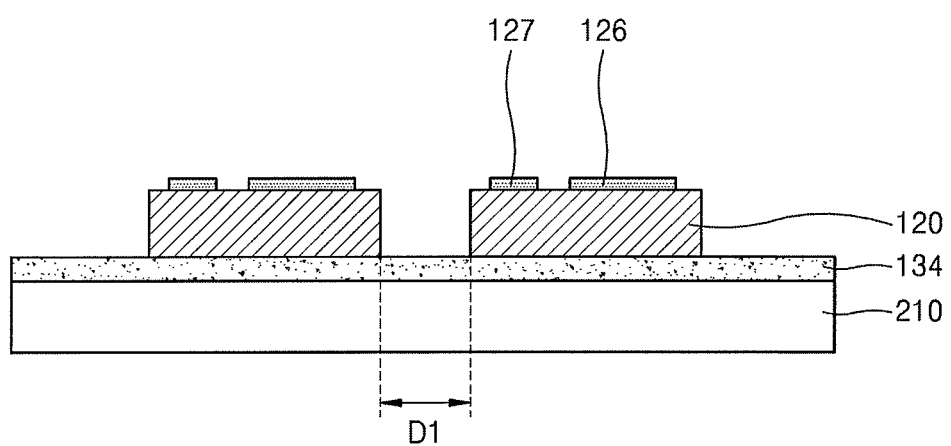
FIGS. 11 to 14 illustrate cross-sectional views and a perspective view of stages in a method of manufacturing a light source module according to an embodiment.

Referring to FIG. 11, a transfer substrate 210 may be prepared. The transfer substrate 210 may include a material that may be neither thermally damaged nor physically changed even if a relatively high temperature is applied in a subsequent process of forming an encapsulation layer 130. The transfer substrate 210 may be, for example, a heat resistant film. Also, the transfer substrate 210 may function as a protective substrate to protect a material included in the encapsulation layer 130 from bringing into direct contact with a mold 220 during a subsequent process of forming the encapsulation layer 130.

A top encapsulation layer 134 may be formed on the transfer substrate 210. In an embodiment, a mixture of a phosphor and a resin may be molded under pressure into a film-type top encapsulation layer 134, and the film-type encapsulation layer 134 may be placed on the transfer substrate 210. In another embodiment, the formation of the top encapsulation layer 134 may include liquid-injecting or spraying a mixture of a phosphor and a resin to the transfer substrate 210 and curing the mixture. In another embodiment, the top encapsulation layer 134 may include a phosphor-free resin, for example, a silicone resin. However, a material included in the top encapsulation layer 134 and a method of forming the top encapsulation layer 134 are not limited thereto.

A plurality of light-emitting devices 120 may be adhered to the top encapsulation layer 134. The plurality of light-emitting devices 120 may be single chips that are separated from one another on a wafer level. The plurality of light-emitting devices 120 may be located such that emission surfaces (or active surfaces) of the plurality of light-emitting devices 120 face the top encapsulation layer 134. The plurality of light-emitting devices 120 may be spaced apart from one another by a predetermined distance D1. For example, the distance D1 may be at least twice a thickness of the top encapsulation layer 134, but embodiments are not limited thereto.

Figure 12:
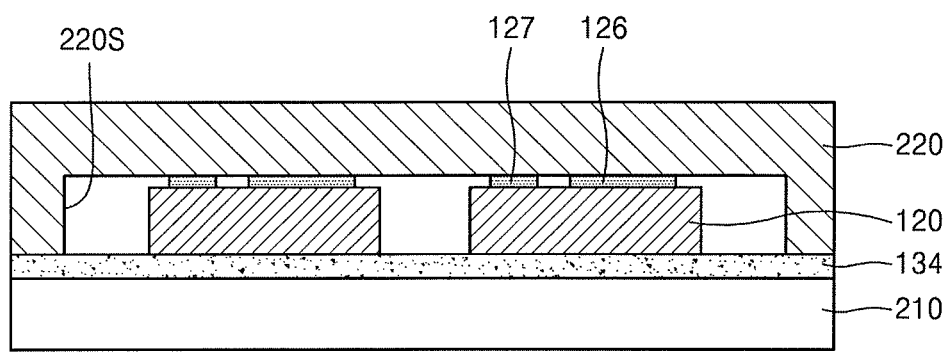

Referring to FIG. 12, a transfer substrate 210 to which the plurality of light-emitting devices 120 are adhered may be located on a lower mold and an upper mold 220 may be located on the lower mold.

The plurality of light-emitting devices 120 may be located in a mold space 220S defined between the upper mold 220 and the lower mold. For example, a width of the transfer substrate 210 may be greater than a width of the mold space 220S, and the transfer substrate 210 and the top encapsulation layer 134 may be placed between the upper mold 220 and the lower mold.

Thereafter, a side encapsulation material may be injected into the mold space 220S. For example, the side encapsulation material may be heated under pressure so that the fused side encapsulation material may be injected under pressure into the mold space 220S to completely fill the mold space 220S. Thus, the side encapsulation material may cover a top surface of the top encapsulation layer 134 and side surfaces of the plurality of light-emitting devices 120.

In an embodiment, the side encapsulation material may be, for example, a mixture of dispersion particles and a resin. For example, the side encapsulation material may include a resin in which dispersion particles of at least one selected from the group of $TiO_2$, ZnO, silica, $Al_2O_3$, and MgO are dispersed.

In another case, the side encapsulation material may include the same material as a material included in the top encapsulation layer 134. In this case, the light source module 100A described with reference to FIG. 5 may be formed.

Figure 13:
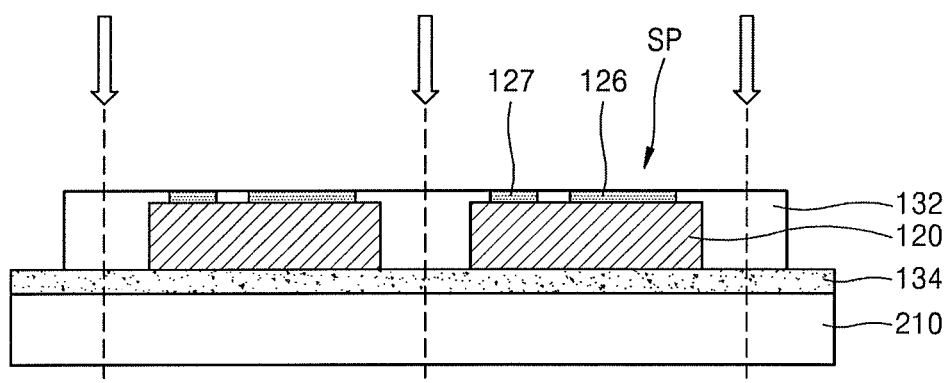

Referring to FIG. 13, the injected side encapsulation material may be cooled and cured to form a side encapsulation layer 132. Thereafter, the upper mold 220 (refer to FIG. 12) and the lower mold may be separated from each other.

Subsequently, the resultant structure may be separated, e.g., sawed to separate a plurality of light-emitting device middle packages SP from one another. Each of the light-emitting device middle packages SP may include a light-emitting device 120, a side encapsulation layer 132 surrounding the side surface of the light-emitting device 120, and a top encapsulation layer 134 covering the top surface of the light-emitting device 120.

Figure 14:
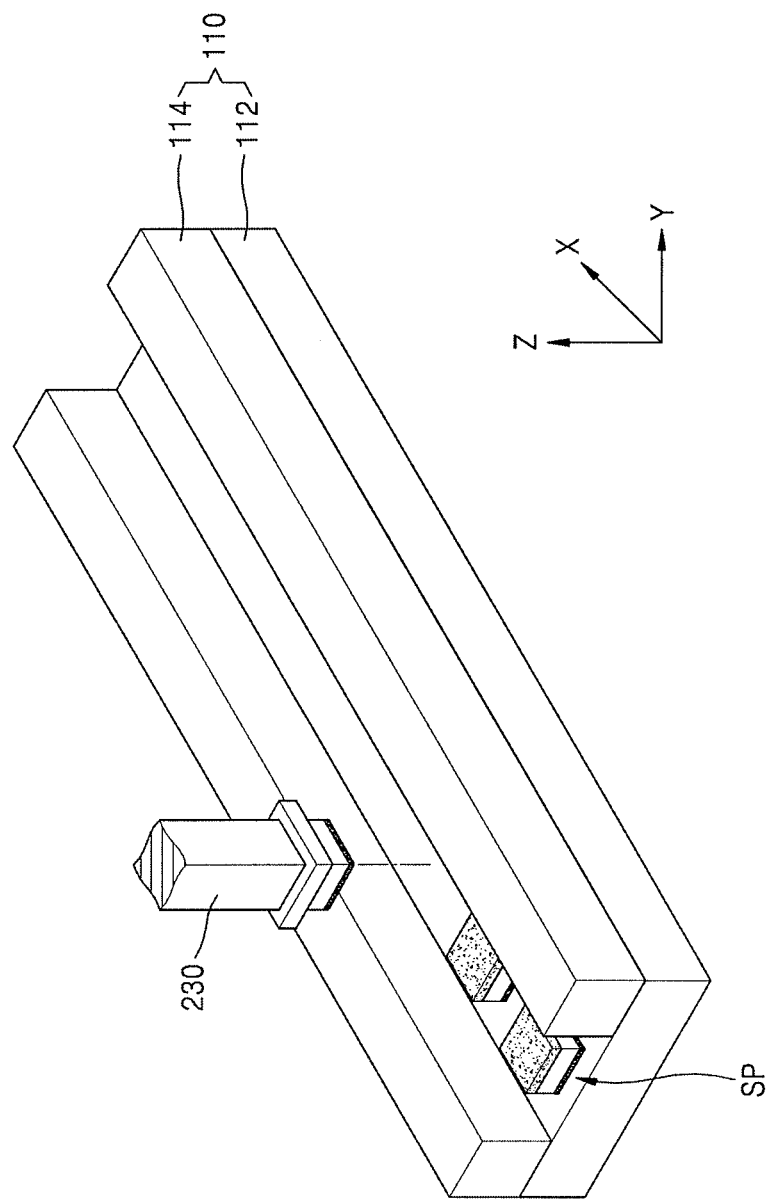

Referring to FIG. 14, the substrate 110 including the base plate 112 and the pair of dam structures 114 may be prepared. In an embodiment, the pair of dam structures 114 may be formed by thermally bonding, for example, an FR4 resin, to the base plate 112 under pressure at a temperature of about 150° C. to about 200° C. for several tens of minutes to several hours.

Thereafter, the light-emitting device middle packages SP may be provided with the adhesive 140 in contact with the first and second electrodes 126, 127 and mounted on the substrate 110, e.g., directly on the base plate 112, by using a collet 230 such that they are spaced apart from one another in the first direction in which the substrate 110 extends. The light-emitting device middle packages SP may be spaced apart from the pair of dam structures 114 along the third direction, e.g., may be centered along the third direction between the pair of dam structures 114.

In the method according to the present embodiment, the light-emitting devices 120 may be adhered to the transfer substrate 210, the top encapsulation layer 134 and the side encapsulation layer 132 may be formed, and the resultant structure may be separated to form the light-emitting device middle packages SP. The light-emitting device middle packages SP may be mounted on the substrate 110 including the pair of dam structures 114. Accordingly, a packaging process using an additional lead frame may not be needed, and a process of manufacturing the light source module 100 may be simplified.

Figure 15:
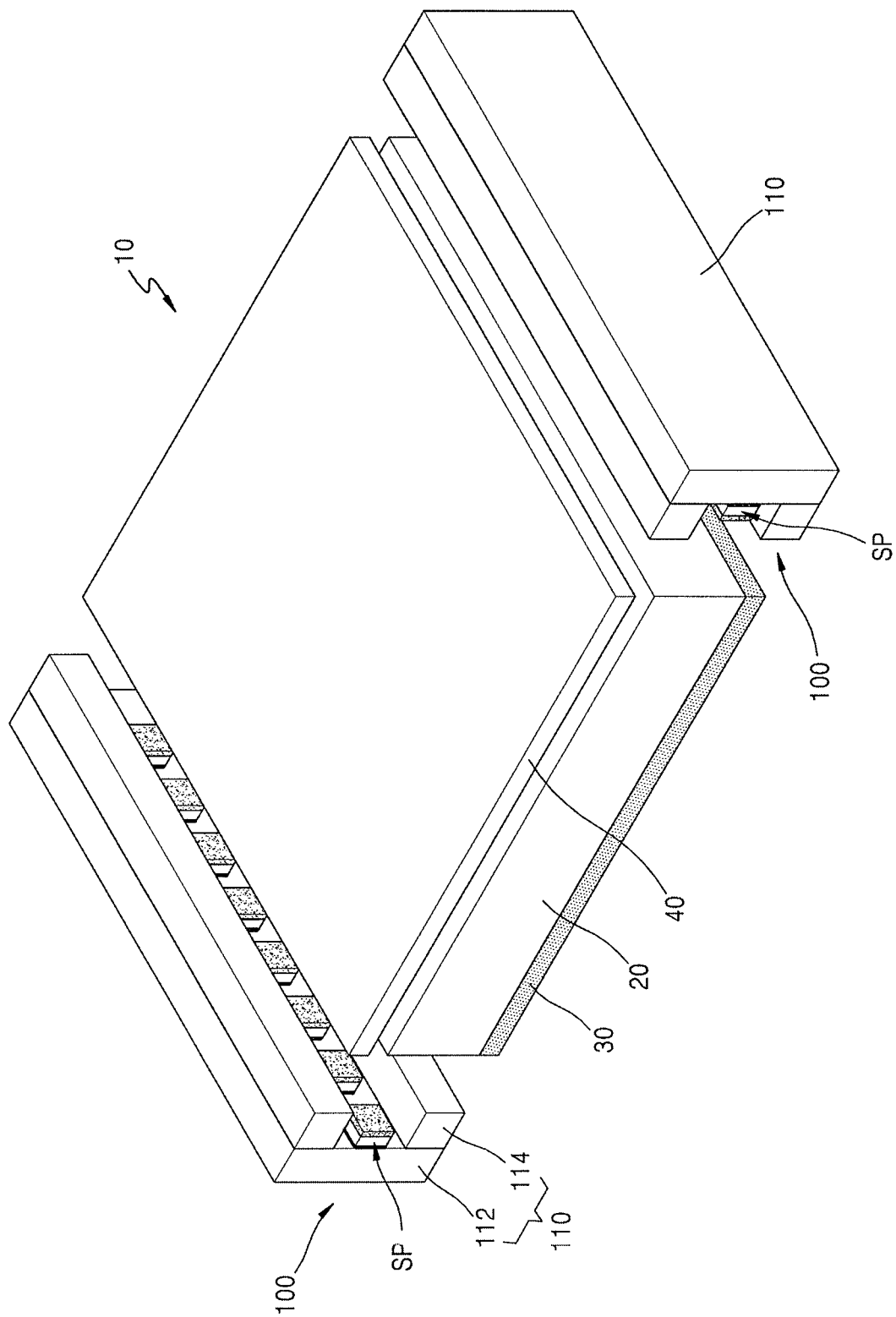
FIG. 15 illustrates a perspective view of a backlight unit (BLU) according to an embodiment.
Figure 16:
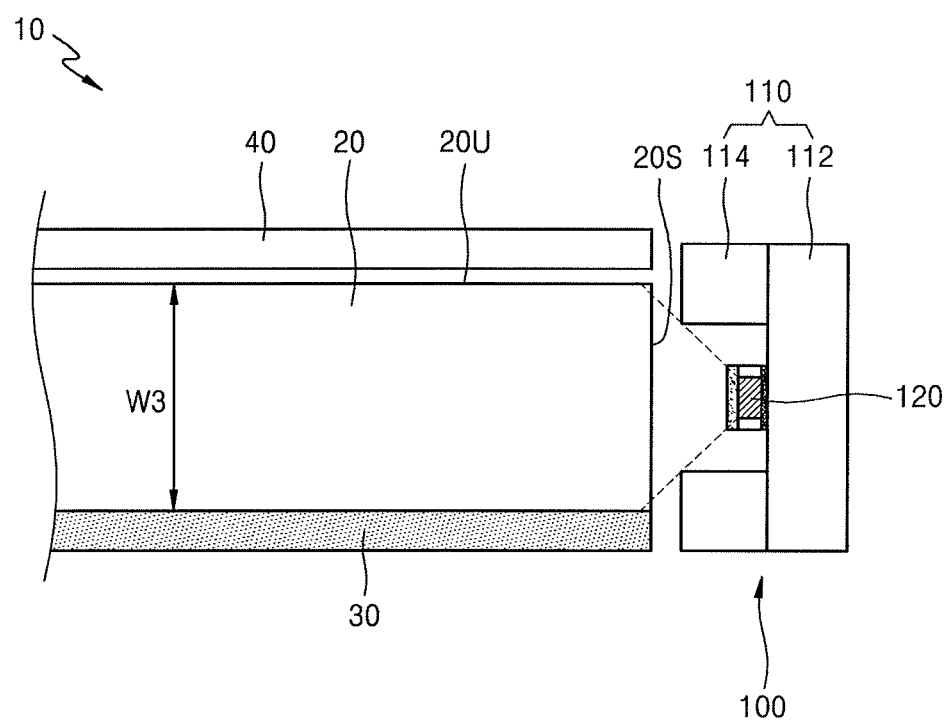
FIG. 16 illustrates an enlarged view of a portion of the BLU of FIG. 15.

FIG. 15 is a perspective view of a backlight unit (BLU) 10 according to an embodiment. FIG. 16 is a cross-sectional view of a portion of the BLU 10 of FIG. 15. Referring to FIGS. 15 and 16, the BLU 10 may include an LGP 20 and a light source module 100 located on opposing side surfaces of the LGP 20. The BLU 10 may be an edge-type BLU.

The LGP 20 may serve as a guide to receive light from the light source module 100 and emit the light. The LGP 20 may have a plate structure having a rectangular parallelepiped shape and include a light transmissive resin. For example, the LGP 20 may include polycarbonate, poly(methyl methacrylate), poly(methyl methacrylate) (PMMA), and/or acryl.

As shown in FIG. 15, a side surface 20S of the LGP 20 may face a plurality of light-emitting devices 120 of the light source module 100. The side surface 20S of the LGP 20 that faces the plurality of light-emitting devices 120 may be a light incidence surface, and a top surface 20U of the LGP 20 may be a light emission surface. Light emitted by the plurality of light-emitting devices 120 may be incident to the LGP 20 through the side surface 20S of the LGP 20 and emitted out of the LGP 20 through the top surface 20U of the LGP 20.

The light source module 100 may include a plurality of light-emitting devices 120 located on a substrate 110. The substrate 110 may include the base plate 112 and the pair of dam structures 114 that extend from two edges of the base plate 112 in a lengthwise direction of the substrate 110. Each of the plurality of light-emitting devices 120 may be surrounded by an encapsulation layer. Characteristics of the light source module 100 may be similar to those described with reference to FIGS. 1 to 3.

FIGS. 15 and 16 illustrate an example in which the BLU 10 includes the light source module 100 described above with reference to FIGS. 1 to 3, but embodiments are not limited thereto. In another case, the BLU 10 may include at least one of the light source modules 100A, 100B, and 100C described above with reference to FIGS. 5 to 10.

In the light source module 100 according to an embodiment, light emitted by the plurality of light-emitting devices 120 may have a relatively small orientation angle of, for example, about 100° to about 130°, due to the pair of dam structures 114. Thus, the LGP 20 may have a relatively small thickness W3.

The BLU 10 may further include a reflection plate 30 located under the LGP 20. Light may be incident to the LGP 20 through a light incidence surface of the reflection plate 30 and reflected toward the top surface 20U of the LGP 20.

The BLU 10 may further include an optical sheet 40 located on the LGP 20. The optical sheet 40 may serve to diffuse light, which is emitted through the top surface 20U of the LGP 20, in various directions or collect the light within a front field of view.

The BLU 10 may further include a housing to contain the light source module 100, the LGP 20, the reflection plate 30, and the optical sheet 40. A shape and a structure of the housing may be variously selected.

In another embodiment, the light source module 100 may be provided on only one side surface of the LGP 20 or further provided on another side surface of the LGP 20.

The BLU 10 may be further include a connection terminal to supply driving power to the light source module 100, and the connection terminal may be connected to a circuit pattern (not shown) formed under the substrate 110.

In conclusion, the above-described BLU 10 may include the light source module 100 having high light intensity and a small orientation angle. Accordingly, a high-quality slim display apparatus may be embodied by using the BLU 10.

By way of summation and review, one or more embodiments provide a light source module on which an increased number of light-emitting devices may be mounted to increase light intensity of the light source module, and a method of manufacturing a light source module by using a simplified process. One or more embodiments provide a backlight unit (BLU) on which an increased number of light-emitting devices may be mounted to increase light intensity of the BLU.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light source module, comprising:
   a substrate including a base plate extending in a first direction and a pair of darn structures stacked on opposing sides of the base plate along a second direction, orthogonal to the first direction and extending along the base plate in the first direction, wherein the pair of darn structures are spaced apart from each other along a third direction, orthogonal to the first and second directions;
   a plurality of light-emitting devices mounted on the substrate between the pair of dam structures, wherein the light-emitting devices are spaced apart from one another in the first direction; and
   an encapsulation layer covering at least a side surface and a top surface of each of the plurality of light-emitting devices, wherein the encapsulation layer includes:
      a side encapsulation layer surrounding substantially an entire area of a side surface of each of the plurality of light-emitting devices; and
      a top encapsulation layer on substantially an entire area of a top surface of each of the plurality of light-emitting devices, wherein the side encapsulation layer includes a different material from the top encapsulation layer, and
      a sidewall of the side encapsulation layer is aligned with a sidewall of the top encapsulation layer,
   wherein the encapsulation layer is spaced from the pair of dam structures, and
   a first height of the pair of dam structures on a top surface of the base plate is greater than a second height from the top surface of the base plate to the top surface of the encapsulation layer.

2. The light source module as claimed in claim 1, wherein the top encapsulation layer includes a resin in which phosphor is dispersed or a phosphor-free resin.

3. The light source module as claimed in claim 1, wherein the side encapsulation layer includes a resin in which dispersion particles of at least one selected from the group of titanium oxide ($TiO_2$), zinc oxide (ZnO), silica, aluminum oxide ($Al_2O_3$), and magnesium oxide (MgO) are dispersed.

4. The light source module as claimed in claim 1, wherein:
   the side encapsulation layer includes a same material as the top encapsulation layer, and
   the side encapsulation layer is formed integrally with the top encapsulation layer.

5. The light source module as claimed in claim 4, wherein the top encapsulation layer and the side encapsulation layer includes a resin in which phosphor is dispersed or a phosphor-free resin.

6. The light source module as claimed in claim 1, wherein the encapsulation layer surrounding one of the plurality of light-emitting devices is spaced apart from the encapsulation layer surrounding another adjacent light-emitting device in the first direction.

7. A light source module, comprising:
   a substrate including a base plate extending in a first direction and a pair of dam structures stacked on opposing sides of the base plate along a second direction, orthogonal to the first direction and extending along the base plate in the first direction, wherein the pair of dam structures are spaced apart from each other along a third direction, orthogonal to the first and second directions;
   a plurality of light-emitting devices mounted on the substrate between the pair of dam structures, wherein the light-emitting devices are spaced apart from one another in the first direction; and
   an encapsulation layer covering at least a side surface and a top surface of each of the plurality of light-emitting devices,
   wherein the encapsulation layer is spaced from the pair of dam structures, and
   a first height of the pair of dam structures on a top surface of the base plate is greater than a second height from the top surface of the base plate to the top surface of the encapsulation layer, and
   wherein:
      each of the plurality of light-emitting devices includes a first side surface facing the pair of dam structures and a second side surface facing an adjacent light-emitting device, and
      the encapsulation layer is on the first side surface and not on the second side surface.

8. The light source module as claimed in claim 1, wherein the pair of dam structures include a different material from the base plate.

9. The light source module as claimed in claim 1, wherein the pair of dam structures include FR-4 resin, transparent plastic, opaque plastic, or an insulating sheet.

10. The light source module as claimed in claim 1, wherein the first height is from about 100% to about 400% of the second height.

11. The light source module as claimed in claim 1, wherein the plurality of light-emitting devices have an orientation angle of about 100° to about 130° relative to the pair of dam structures.

12. A light source module, comprising:
- a substrate including a base plate extending in a first direction and a pair of dam structures stacked on opposing sides of the base plate along a second direction, orthogonal to the first direction and extending along the base plate in the first direction, wherein the pair of dam structures are spaced apart from each other along a third direction, orthogonal to the first and second directions;
- a plurality of light-emitting devices mounted between the pair of dam structures on the substrate and spaced apart from one another in the first direction, the plurality of light-emitting devices being spaced apart from the pair of dam structures in the third direction; and
- an encapsulation layer covering at least one side surface and a top surface of each of the plurality of light-emitting devices, wherein
- the encapsulation layer fills a space between the pair of dam structures such that two sidewalls of the encapsulation layer are defined by the pair of dam structures, and
- a height of the encapsulation layer over each of the plurality of light-emitting devices is equal to or greater than a height of the sidewalls of the encapsulation layer and an upper surface of the encapsulation layer over each of the plurality of light-emitting devices is planar or convex.

13. The light source module as claimed in claim 12, wherein each of the light-emitting devices are directly mounted on the base plate using an adhesive.

14. The light source module as claimed in claim 12, wherein an upper surface of the encapsulation layer is planar.

15. The light source module as claimed in claim 14, wherein the upper surface of the encapsulation layer is coplanar with top surfaces of the pair of dam structures.

16. The light source module as claimed in claim 12, wherein sidewalls of the pair of dam structures are orthogonal to the base plate.

17. The light source module as claimed in claim 12, wherein the pair of dam structures are opaque or transparent.

* * * * *